US008847168B2

(12) United States Patent
Kim et al.

(10) Patent No.: US 8,847,168 B2
(45) Date of Patent: Sep. 30, 2014

(54) LARGE-SCALE X-RAY DETECTORS AND METHODS OF MANUFACTURING THE SAME

(75) Inventors: Sun-il Kim, Osan-si (KR); Jae-chul Park, Suwon-si (KR); Sang-wook Kim, Yongin-si (KR); Chang-jung Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 937 days.

(21) Appl. No.: 12/929,203

(22) Filed: Jan. 7, 2011

(65) Prior Publication Data
US 2011/0309259 A1 Dec. 22, 2011

(30) Foreign Application Priority Data

Jun. 21, 2010 (KR) ........................ 10-2010-0058624

(51) Int. Cl.
*G01T 1/24* (2006.01)
*H01L 31/08* (2006.01)
*H01L 27/146* (2006.01)

(52) U.S. Cl.
CPC ............. *G01T 1/24* (2013.01); *H01L 27/14687* (2013.01); *H01L 27/14636* (2013.01); *H01L 27/14609* (2013.01); *H01L 27/14618* (2013.01); *H01L 27/14676* (2013.01); *H01L 31/085* (2013.01); *H01L 27/14634* (2013.01)
USPC ................................. 250/370.09; 250/E27.14

(58) Field of Classification Search
CPC ........................................................ G01T 1/24
USPC ..................... 250/370.09, 208.1; 257/E27.14, 257/E31.124
See application file for complete search history.

(56) References Cited

U.S. PATENT DOCUMENTS

| | | | |
|---|---|---|---|
| 5,182,624 A | 1/1993 | Tran et al. | |
| 6,510,195 B1 | 1/2003 | Chappo et al. | |
| 7,339,246 B2 | 3/2008 | Nascetti et al. | |
| 7,361,881 B2 * | 4/2008 | Spartiotis | 250/214 L |
| 2003/0155516 A1 * | 8/2003 | Spartiotis et al. | 250/370.09 |
| 2004/0195640 A1 | 10/2004 | Nascetti et al. | |

FOREIGN PATENT DOCUMENTS

| | | |
|---|---|---|
| JP | 07333348 A | 12/1995 |
| JP | 2000035480 A | 2/2000 |
| KR | 100647212 A | 11/2006 |
| KR | 20100011101 A | 2/2010 |

* cited by examiner

*Primary Examiner* — David Porta
*Assistant Examiner* — Faye Boosalis
(74) *Attorney, Agent, or Firm* — Harness, Dickey & Pierce, P.L.C.

(57) ABSTRACT

Large-scale X-ray detectors and methods of manufacturing the same are provided, the large-scale X-ray detectors include a photoconductor layer configured to generate electrical charges according to an incident X-ray using an entire area of the photoconductor layer, a common electrode on an upper surface of the photoconductor layer, a plurality of pixel electrodes, configured to convert the electrical charges into electrical signals, on a lower surface of the photoconductor layer and divided into a plurality of groups, and a plurality of application-specific integrated circuits (ASICs) each corresponding to one of the groups. Each ASIC is configured to process the electrical signals conveyed via the pixel electrodes in the corresponding group. The ASICs process the electrical signals so that seamless image information is collectively generated by the ASICs with respect to the entire area of the photoconductor layer.

34 Claims, 10 Drawing Sheets

LARGE-SCALE X-RAY DETECTORS AND METHODS OF MANUFACTURING THE SAME

CROSS-REFERENCE TO RELATED APPLICATIONS

This application claims the benefit of priority under 35 U.S.C. §119 from Korean Patent Application No. 10-2010-0058624, filed on Jun. 21, 2010, in the Korean Intellectual Property Office, the disclosure of which is incorporated herein in its entirety by reference.

BACKGROUND

1. Field

Example embodiments relate to large-scale X-ray detectors capable of forming a seamless image, and methods of manufacturing the same.

2. Description of the Related Art

Digital X-ray detectors output a digital signal corresponding to an X-ray image, or an X-ray-penetration image, that is captured using an X-ray. Digital X-ray detectors use a direct X-ray detection method, or an indirect X-ray detection method.

In the direct X-ray detection method, an X-ray is directly transformed into an electric charge in a photoconductor. In the indirect X-ray detection method, an X-ray is transformed into a visible ray by using a scintillator, and then the visible ray is transformed into an electric charge by using a photoelectric transformation element (e.g., a photodiode).

Digital X-ray detectors using the direct X-ray detection method include a plurality of pixel electrodes formed on a lower portion of a photoconductor layer, and a signal processor that processes an electrical signal from the photoconductor layer.

In conventional digital X-ray detectors using the direct X-ray detection method, application-specific integrated circuits (ASICs) having the photoconductor layer thereon are tiled to be spaced apart from each other, and seams between the ASICs are areas where an X-ray image may not be detected. In particular, when the ASICs are tiled, a seam having a gap of at least 100 μm or more may be formed, and X-ray images that are present in the seam may not be detected.

SUMMARY

Example embodiments relate to large-scale X-ray detectors capable of forming a seamless image, and methods of manufacturing the same.

Provided are large-scale X-ray detectors including a planarization layer for electrical connections between application-specific integrated circuits (ASICs) and pixel electrodes, and methods of manufacturing the same.

Additional aspects will be set forth in part in the description which follows and, in part, will be apparent from the description, or may be learned by practice of the presented embodiments.

According to example embodiments, an X-ray detector includes a photoconductor layer configured to generate electrical charges according to an incident X-ray, a common electrode formed on an upper surface of the photoconductor layer, a plurality of pixel electrodes formed on a lower surface of the photoconductor layer, and a plurality of application-specific integrated circuits (ASICs) in which the plurality of pixel electrodes are divided into a plurality of groups. The pixel electrodes are configured to convert the electrical charges into electrical signals. Each ASIC is configured to process the electrical signals conveyed via the pixel electrodes in the corresponding group. The electrical signals are generated with respect to an entire area of the photoconductor layer and are conveyed to the plurality of ASICs via the plurality of pixel electrodes and, then are processed so that seamless image information is generated with respect to the entire area of the photoconductor layer.

The pixel electrodes and the ASICs may contact one another via contact plugs.

The X-ray detector may further include a polymer planarization layer formed between the pixel electrodes and the ASICs, wherein the contact plugs are formed in via holes formed in the polymer planarization layer.

The photoconductor layer may be formed of at least one material selected from the group consisting of amorphous selenium (a-Se), $HgI_2$, $PbI_2$, CdTe, CdZnTe, PbO and combinations thereof.

The planarization layer may include a first planarization layer formed on the ASICs, and a second planarization layer formed on the first planarization layer. The contact plugs may each include a first contact plug formed through the first planarization layer, and, a second contact plug formed through the second planarization layer, wherein the X-ray detector further includes a connection wiring connecting the first contact plug and the second contact plug.

The X-ray detector may further include a substrate and an insulating layer sequentially stacked on the pixel electrodes to the ASICs, wherein the contact plugs may each include a first contact plug formed through the insulating layer, and a second contact plug formed through the substrate. The X-ray detector further includes a connection wiring connecting the first contact plug and the second contact plug.

According to example embodiments, an X-ray detector includes a plurality of application-specific integrated circuits (ASICs) tiled on a printed circuit board (PCB) and electrically connected to the PCB, a planarization layer covering the plurality of ASICs on the PCB, a plurality of pixel electrodes formed on the planarization layer to correspond to the ASICs, a photoconductor layer covering the plurality of pixel electrodes on the planarization layer, a common electrode on the photoconductor layer to face the plurality of pixel electrodes and on which an X-ray is incident, and contact plugs filling via holes formed in the planarization layer to electrically connect the pixel electrodes and contacts of the ASICs.

The planarization layer may include a polymer layer.

The X-ray detector may further include a first connection wiring electrically connecting the contact plugs and the pixel electrodes. The connection wiring may be formed on the planarization layer.

The planarization layer may include a plurality of planarization layers formed on the ASICs wherein the pixel electrodes are formed on an uppermost planarization layer, and the contact plugs are each formed in via holes formed in each of the plurality of planarization layers. The X-ray detector may further include a second connection wiring formed between the plurality of planarization layers and connecting the contact plugs formed in adjacent planarization layers.

The photoconductor layer may be formed of one material selected from the group consisting of amorphous selenium (a-Se), $HgI_2$, $PbI_2$, CdTe, CdZnTe, PbO and combinations thereof.

The ASICs may include single crystalline silicon.

According to example embodiments, an X-ray detector includes a plurality of application-specific integrated circuits (ASICs) tiled on a printed circuit board (PCB) and electrically connected to the PCB, an insulating layer and a substrate sequentially stacked on the plurality of ASICs, a plurality of pixel electrodes formed on the substrate to correspond to the ASICs, a photoconductor layer covering the plurality of pixel electrodes on the substrate, and a common electrode on the photoconductor layer to face the plurality of pixel electrodes and on which an X-ray is incident. The pixel electrodes and contacts of the ASICs are connected to one another by contact plugs filled in via holes formed in each of the substrate and the insulating layer.

The contact plugs of the insulating layer and the contacts of the ASICs may be connected to one another by bumps.

The X-ray detector may further include a first connection wiring between the contact plugs in the substrate and the contact plugs in the insulating layer to electrically connect the contact plugs in the substrate and the contact plugs in the insulating layer.

The first connection wiring may be formed on the substrate.

The insulating layer may include a plurality of insulating layers formed on the ASICs, and the contact plugs may be formed in each of the insulating layers. The X-ray detector may further include a second connection wiring formed between the adjacent insulating layers of the plurality of insulating layers to connect the contact plugs in the adjacent insulating layers.

The photoconductor layer may be formed of at least one material selected from the group consisting of amorphous selenium (a-Se), $HgI_2$, $PbI_2$, CdTe, CdZnTe, PbO and combinations thereof.

The ASICs may include single crystalline silicon.

According to example embodiments, a method of manufacturing an X-ray detector includes tiling a plurality of application-specific integrated circuits (ASICs) in the form of an array on a printed circuit board (PCB), depositing a planarization layer that covers the ASICs on the PCB, forming via holes corresponding to contacts of the ASICs in the planarization layer and forming contact plugs in the via holes, forming a plurality of pixel electrodes on the planarization layer to contact the contact plugs, forming a photoconductor layer on the planarization layer to cover the plurality of pixel electrodes, and forming a common electrode on the photoconductor layer.

The planarization layer may include a polymer layer.

The deposition of the planarization layer may include chemical mechanical polishing (CMP) the planarization layer.

The formation of the contact plugs may include forming a first metal layer on the planarization layer and in the via holes, forming the contact plugs from the first metal layer in the via holes, and forming a first connection wiring connected to the pixel electrodes by patterning the first metal layer on the planarization layer.

The formation of the contact plugs and the deposition of the planarization layer may include depositing a plurality of planarization layers on the PCB, forming via holes corresponding to the contacts of the ASICs in each planarization layer, wherein contact plugs are filled in the via holes, and forming a second connection wiring to connect corresponding contact plugs in adjacent planarization layers of the plurality of planarization layers.

The photoconductor layer may be formed of at least one material selected from the group consisting of amorphous selenium (a-Se), $HgI_2$, $PbI_2$, CdTe, CdZnTe, PbO and combinations thereof.

The ASICs may include single crystalline silicon.

According to example embodiments, a method of manufacturing an X-ray detector includes tiling a plurality of application-specific integrated circuits (ASICs) in the form of an array on a printed circuit board (PCB), forming first via holes corresponding to contacts of the ASICs in a substrate and forming first contact plugs in the first via holes, forming a first connection wiring connected to the first contact plugs on a first surface of the substrate, forming an insulating layer that covers the first connection wiring on the first surface of the substrate, forming second via holes exposing the first connection wiring in the insulating layer and forming second contact plugs in the second via holes, bonding the substrate to the plurality of ASICs by bumps so that the second contact plugs are connected to the contacts of the plurality of ASICs, forming a plurality of pixel electrodes that contact the first contact plugs on a second surface of the substrate, and sequentially forming a photoconductor layer that covers the plurality of pixel electrodes and a common electrode on the second surface of the substrate.

The formation of the first contact plugs may include forming the via holes in the substrate to a set depth, forming the first contact plugs in the via holes, disposing an insulating substrate to contact the first contact plugs in the substrate, an exposing the first contact plugs by performing chemical mechanical polishing (CMP) of the substrate. The formation of the pixel electrodes includes removing the insulating substrate.

The formation of the insulating layer may include forming a plurality of insulating layers. The formation of the second contact plugs may include forming second via holes exposing the first connection wiring in each of the insulating layers, forming second contact plugs from among the contact plugs in the second via holes, and forming a second connection wiring that connects the second contact plugs between adjacent insulating layers of the plurality of insulating layers. The formation of the pixel electrodes includes forming the pixel electrodes connected to exposed second contact plugs.

The photoconductor layer may be formed of one material selected from the group consisting of amorphous selenium (a-Se), $HgI_2$, $PbI_2$, CdTe, CdZnTe, PbO and combinations thereof.

The ASICs may include single crystalline silicon.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
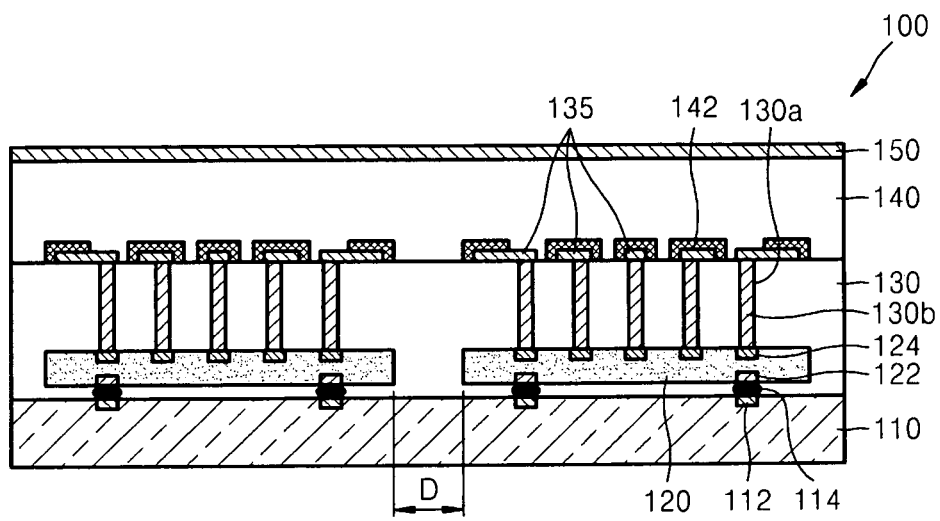
FIG. 1 is a schematic cross-sectional view of a large-scale X-ray detector according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to large-scale X-ray detectors capable of forming a seamless image, and methods of manufacturing the same.

FIG. 1 is a schematic cross-sectional view of a large-scale X-ray detector 100 according to example embodiments.

Referring to FIG. 1, a large-scale X-ray detector 100 is constituted in such a way that a plurality of application-specific integrated circuits (ASICs) 120 in the form of an array are tiled on a printed circuit board (PCB) 110. A plurality of contacts 122 are formed in a lower portion of each of the ASICs 120, and a plurality of contacts 112 corresponding to the contacts 122 are formed on the PCB 110. The ASICs 120 are connected to the PCB 110 via bumps 114.

The ASICs 120 may be formed of single crystalline silicon. The ASICs 120 formed of single crystalline silicon having fast operating speed and/or relatively low noise. Also, the ASICs 120 may increase speed at which electrical signals from a photoconductor is primarily processed, and may transmit electrical signals to the PCB 110.

Due to a limitation in a mask used in a semiconductor process, the ASIC 120 may be manufactured to a maximum size of about 2 cm×2 cm. Approximately several ten thousands to several hundred thousands of pixel areas may be formed in one ASIC 120. Reference "D" denotes a separation distance (or a seam area) between the ASICs 120.

The PCB 110 quantifies transmittance of an X-ray through an object to be measured, by using electrical signals input by the ASICs 120 to generate an image signal. The ASICs 120 are used to process electrical signals input by a plurality of pixel electrodes at high speed and to provide necessary information to the PCB 110 to reduce a signal processing time in the PCB 110.

A planarization layer 130 that covers the ASICs 120 is formed on the PCB 110. The planarization layer 130 may be formed of polymer (e.g., SU-8 photoresist or polyimide). The planarization layer 130 is formed to a thickness of about 200 µm to about 500 µm. A plurality of via holes 130a for exposing a plurality of contacts 124 of the ASICs 120 are formed on the planarization layer 130. A plurality of contact plugs 130b are filled into the via holes 130a. The contact plugs 130b may be formed of aluminum (Al), copper (Cu), or the like.

An X-ray detecting unit including a photoconductor layer 140 is disposed on the planarization layer 130. The photoconductor layer 140 may be a layer formed of one material. The photoconductor layer 140 may be formed of one material selected from the group consisting of amorphous selenium (a-Se), $HgI_2$, $PbI_2$, CdTe, CdZnTe, PbO and combinations thereof.

The photoconductor layer 140 may have a thickness that varies according to an object to be measured. For example, in case the photoconductor layer 140 is formed of $HgI_2$, the thickness of the photoconductor layer 140 may be about 500 µm to about 600 µm when, for example, a chest is to be measured, and may be about 300 µm to about 400 µm when, for example, a breast is to be measured. In case the photoconductor layer 140 is formed of a-Se, the thickness of the photoconductor layer 140 may be about 900 µm to about 1000 µm when, for example, a chest is to be measured, and may be about 300 µm to about 400 µm when, for example, a breast is to be measured.

The photoconductor layer 140 generates an electric charge according to the strength of an X-ray that is incident on a top (or upper) surface of the photoconductor layer 140. The photoconductor layer 140 may include a plurality of seamless pixel areas. The pixel electrodes 142 are formed in a lower portion of each of the seamless pixel areas, and electric charges generated in the seamless pixel areas are converted into electrical signals at the corresponding pixel electrode 142. The electrical signals are transmitted to the contacts 122 of the ASICs 120.

A continuous common electrode 150 is formed on the photoconductor layer 140. An electric field is formed in the photoconductor layer 140 according to a direct current (DC) voltage applied to the common electrode 150, and holes or electrons of hole-electron pairs formed in the photoconductor layer 140 are moved to the pixel electrodes 142. The moving electric charges in the photoconductor layer 140 may vary according to the material used to form the photoconductor layer 140. Thus, a positive or negative voltage may be applied to the common electrode 150.

The pixel electrodes 142 are connected to the contacts 124 via the contact plugs 130b and a horizontal wiring 135. The reason for the horizontal wiring 135 will be described with reference to FIG. 2. Hereinafter, the horizontal wiring 135 may be referred to as a connection wiring.

Figure 2:
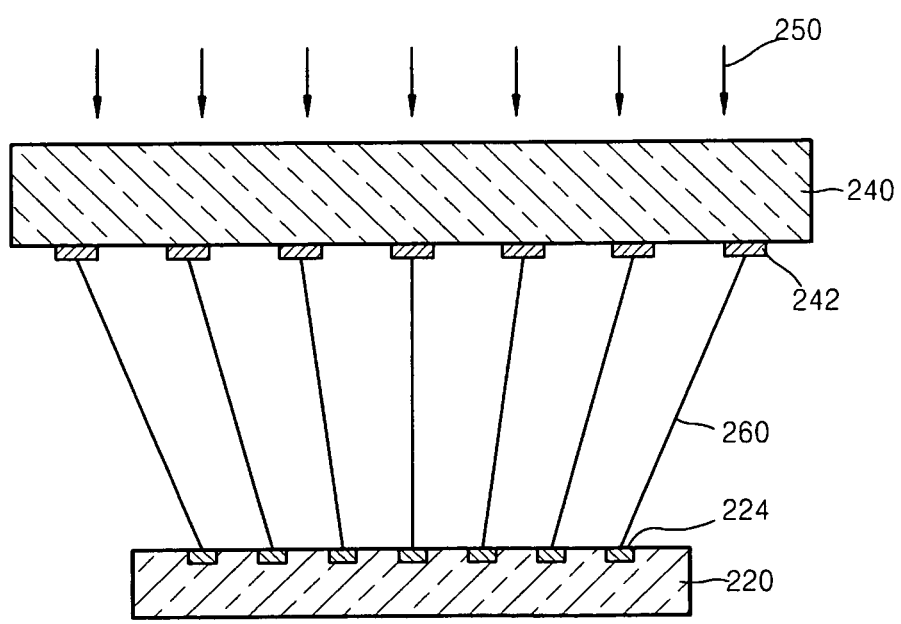
FIG. 2 is a schematic cross-sectional view for explaining electrical connections between a plurality of pixel electrodes and a plurality of application-specific integrated circuits (ASICs) in the large-scale X-ray detector according to example embodiments.

FIG. 2 is a schematic cross-sectional view for explaining electrical connections between pixel, electrodes and ASICs in the large-scale X-ray detector according to example embodiments.

Referring to FIG. 2, because the ASICs 220 are tiled, a separation area (seam area) (see D of FIG. 1), in which adjacent ASICs 220 are separated from one another by a set distance, is formed. On the other hand, because an X-ray 250 is incident over all parts of the photoconductor layer 240, the area of the photoconductor layer 240 on which an X-ray is incident is greater than a total surface area of the ASICs 220. Thus, an inclined connection wiring 260 is required so as to connect the pixel electrodes 242 and contacts 224 of the ASICs 220 to one another, as illustrated in FIG. 2. However, according to the large-scale X-ray detector 100 illustrated in FIG. 1, the horizontal wiring 135 is used to connect the contact plugs 130b, which are vertically formed to the pixel electrodes 142.

In the large-scale X-ray detector 100, electrical connections between the tiled ASICs 120 and the pixel electrodes 142 are easily arranged via the planarization layer 130. Thus, the electric charges detected in the photoconductor layer 140 in the seam area between the ASICs 120 are conveyed to the ASICs 220, and an image in an imaging area may be more precisely reproduced.

Figure 3:
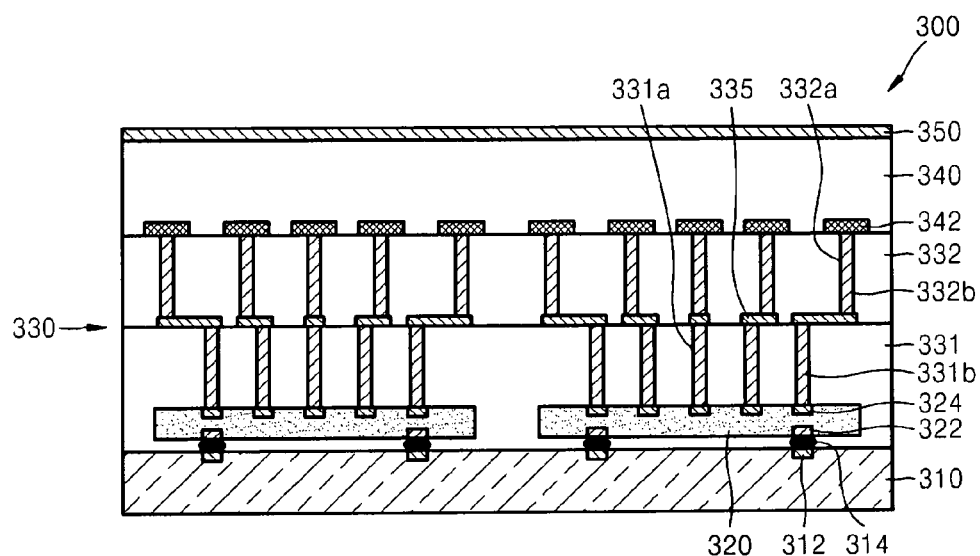
FIG. 3 is a schematic cross-sectional view of a large-scale X-ray detector according to example embodiments.

FIG. 3 is a schematic cross-sectional view of a large-scale X-ray detector according to example embodiments.

Referring to FIG. 3, a large-scale X-ray detector 300 is constituted in such a way that ASICs 320 in the form of an array are tiled on a PCB 310. A plurality of contacts 322 are formed in a lower portion of each of the ASICs 320. The contacts 322 of the ASICs 320 are electrically connected to contacts 312 of the PCB 310 via bumps 314.

A planarization layer 330 is formed on the PCB 310 to cover the ASICs 320. The planarization layer 330 may be formed of polymer (e.g., SU-8 photoresist or polyimide). The planarization layer 331 is formed to a thickness of about 200 µm to 500 µm and includes two layers (i.e., first and second planarization layers 331 and 332). In the first planarization layer 331, via holes 331a for exposing contacts 324 formed in an upper portion of the ASICs 320, and first contact plugs 331b filled into the via holes 331a, are formed. A connection wiring 335 connected to the first contact plugs 331b is further formed on the first planarization layer 331.

In the second planarization layer 332, via holes 332a corresponding to pixel electrodes 342 and second contact plugs 332b filled into the via holes 332a, are formed. The second contact plugs 332b are electrically connected with the corresponding first contact plugs 331b via the connection wiring 335. The first contact plugs 331b and the second contact plugs 332b may be formed of aluminum (Al), copper (Cu) or the like.

The X-dray detector 300 includes a photoconductor layer 340 that is disposed on the second planarization layer 332. The photoconductor layer 340 may be a layer formed of one material. The photoconductor layer 340 may be formed of one material selected from the group consisting of a-Se, $HgI_2$, $PbI_2$, CdTe, CdZnTe, PbO and combinations thereof. The photoconductor layer 340 generates an electric charge according to the strength of an X-ray that is incident on a top surface of the photoconductor layer 340. The photoconductor layer 340 may include a plurality of seamless pixel areas. The pixel electrodes 342 are formed in a lower portion of each of the seamless pixel areas, and electric charges generated in the seamless pixel areas are converted into electrical signals. The electrical signals are transmitted to the contacts 322 of the ASICs 320.

A continuous common electrode 350 is formed on the photoconductor layer 340. An electric field is formed in the photoconductor layer 340 according to a DC voltage applied to the common electrode 350, and holes or electrons of hole-electron pairs generated in the photoconductor layer 340 are moved to the pixel electrodes 142.

Although not shown in FIG. 3, a connection wiring (refer to the connection wiring 135) may be further formed between the second contact plugs 332b and the pixel electrodes 342.

The X-ray detector 300 illustrated in FIG. 3 uses the first planarization layer 331 and the second planarization layer 332 so that the connection wiring 335 may be more easily disposed.

In FIG. 3, the planarization layer 330 includes two layers. However, example embodiments of the present invention are not limited thereto. For example, the planarization layer may include three planarization layers, and contact plugs are formed at each planarization layer. Corresponding contact plugs in adjacent planarization layers are connected by a connection wiring therebetween.

FIGS. 4A through 4E are cross-sectional views illustrating a method of manufacturing the large-scale X-ray detector illustrated in FIG. 1.

Figure 4A:
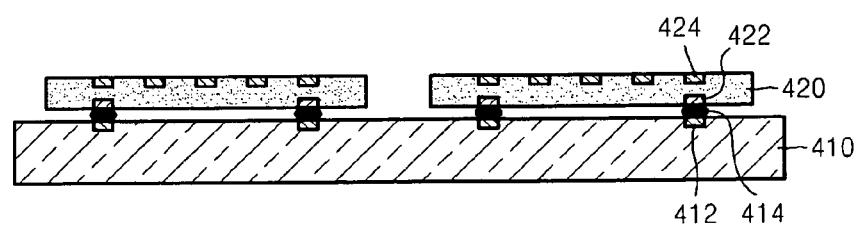
FIGS. 4A through 4E are cross-sectional views illustrating a method of manufacturing the large-scale X-ray detector illustrated in FIG. 1.

Referring to FIG. 4A, a plurality of contacts 412 are formed on a PCB 410. A plurality of ASICs 420 in the form of an array is disposed on the PCB 410. Contacts 422 are formed in lower portions of the ASICs 420, and the ASICs 420 and the PCB 410 are electrically connected to each other by bumps 414 formed between the contacts 412 and 422. The bumps 414 may be formed on the contacts 422 of the ASICs 420 or the contacts 412 of the PCB 410 in advance. Alternatively, the bumps 414 may be formed on both of the contacts 422 of the ASICs 420 and the contacts 412 of the PCB 410 in advance, and then may be combined to electrically connect the ASICs 420 to the PCB 410.

A plurality of contacts 424 are formed in upper portions of the ASICs 420 and will be described later.

Figure 4B:
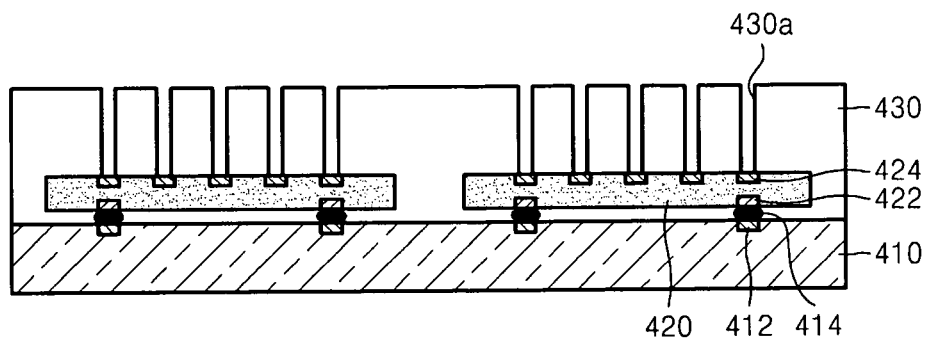

Referring to FIG. 4B, a first planarization layer 430 that covers the ASICs 420 is formed on the PCB 410. The first planarization layer 430 may be formed as a polymer layer formed of SU-8 photoresist or polyimide, for example. The planarization layer 430 may be formed above the ASICs 420 to have a thickness of about 200 µm to 500 µm.

The planarization layer 430 is cured for a set amount of time. In order to planarize the planarization layer 430, a chemical mechanical polishing (CMP) process may be further performed. Via holes 430a for exposing the contacts 424 of the ASICs 420 are formed using a semiconductor process.

Figure 4C:
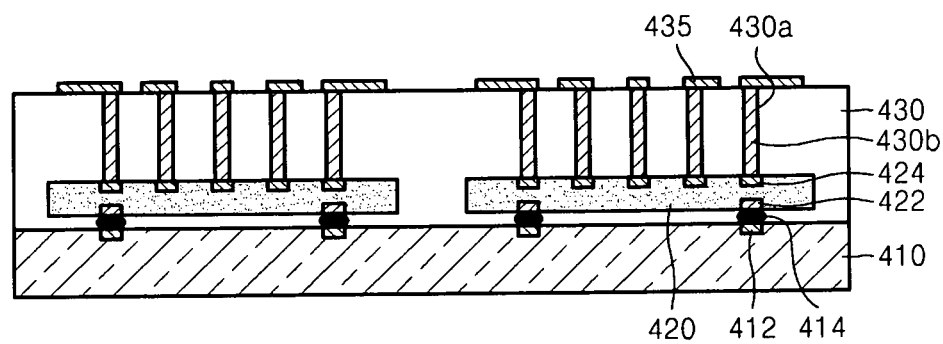

Referring to FIG. 4C, a first metal (e.g., Al or Cu) is used to fill the via holes 430a to form first contact plugs 430b. A connection wiring 435 connected to the first contact plugs 430b is formed by patterning the first metal layer on the first planarization layer 430.

Figure 4D:
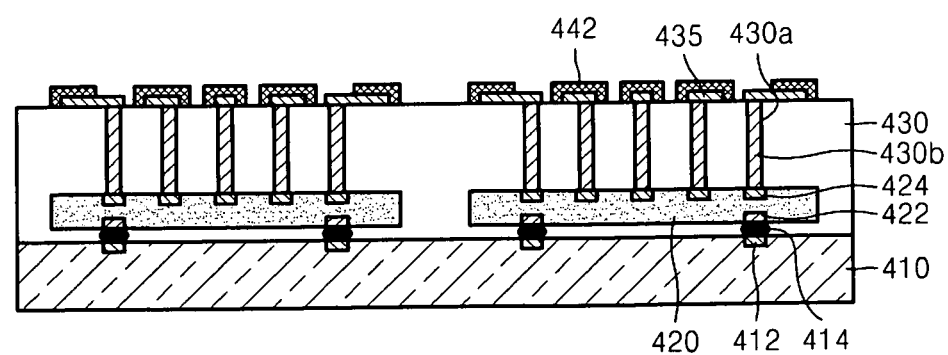

Referring to FIG. 4D, a second metal layer (not shown) that covers the first contact plugs 430b may be deposited on the first planarization layer 430. Pixel electrodes 442 are formed by patterning the second metal layer.

The second metal layer may be formed of the same material as the first contact plugs 430b. Also, the second metal layer may be formed together with the first metal layer during a process of forming the first metal layer.

Figure 4E:
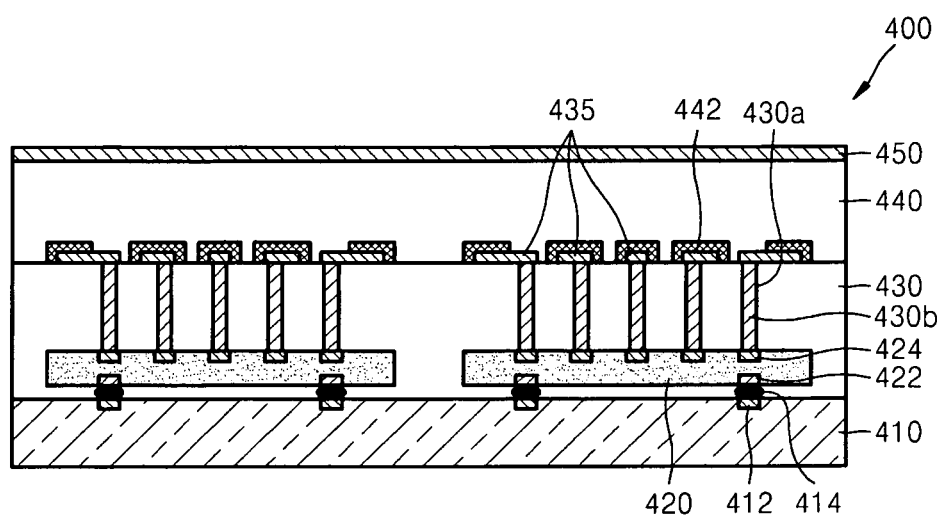

Referring to FIG. 4E, a photoconductor layer 440 and a common electrode 450 are sequentially formed on the first planarization layer 430. The photoconductor layer 440 may be formed of one material selected from the group consisting of a-Se, $HgI_2$, $PbI_2$, CdTe, CdZnTe, PbO and combinations thereof by sputtering or electron beam deposition. The photoconductor layer 440 may have a thickness that varies according to an object to be measured. For example, when a material for forming the photoconductor layer 440 is $HgI_2$, the thickness of the photoconductor layer 440 may be about 500 µm to about 600 µm when a chest is to be measured, and the thickness of the photoconductor layer 440 may be about 300 µm to about 400 µm when a breast is to be measured. When a material for forming the photoconductor layer 440 is a-Se, the thickness of the photoconductor layer 440 may be about 900 µm to about 1000 µm when a chest is to be measured, and the thickness of the photoconductor layer 440 may be about 300 µm to about 400 µm when a breast is to be measured.

The common electrode 450 is formed by depositing Al or Cu to a thickness of approximately several hundreds to several thousands of □.

FIGS. 5A through 5F are cross-sectional views illustrating a method of manufacturing the large-scale X-ray detector illustrated in FIG. 3.

Figure 5A:
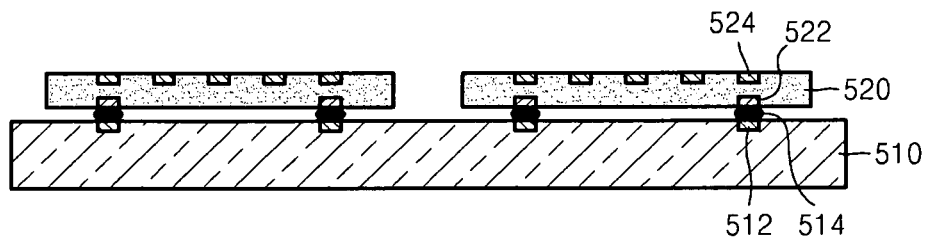
FIGS. 5A through 5F are cross-sectional views illustrating a method of manufacturing the large-scale X-ray detector illustrated in FIG. 3.

Referring to FIG. 5A, a plurality of contacts 512 are formed on a PCB 510. A plurality of ASICs 520 in the form of an array is disposed on the PCB 510. Contacts 522 are formed in lower portions of the ASICs 520, and the ASICs 520 and the PCB 510 are electrically connected to each other by bumps 514 formed between the contacts 512 and 522. The bumps 514 may be formed on the contacts 522 of the ASICs 520 or the contacts 512 of the PCB 510 in advance. Alternatively, the bumps 514 may be formed on both the contacts 522 of the ASICs 520 and the contacts 512 of the PCB 510 in advance, and then may be combined to electrically connect the ASICs 520 to the PCB 510. Contacts 524 are formed in upper portions of the ASICs 520.

Figure 5B:
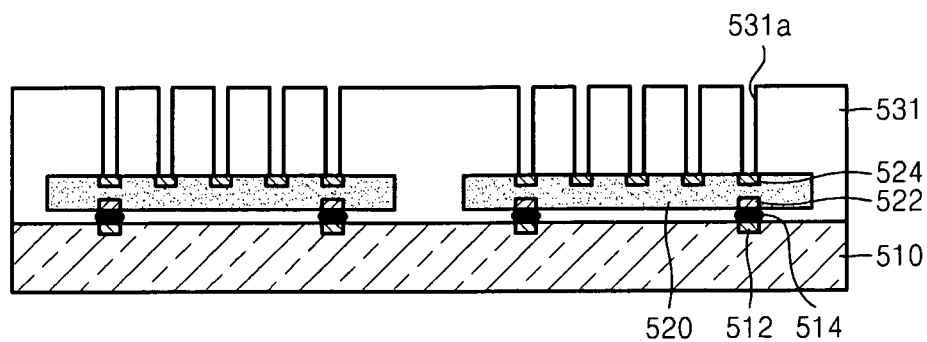

Referring to FIG. 5B, a first planarization layer 531 that covers the ASICs 520 is formed on the PCB 510. The first planarization layer 531 may be formed as a polymer layer formed of SU-8 photoresist or polyimide, for example. The first planarization layer 531 may be formed above the ASICs 520 to have a thickness of about 50 µm to about 300 µm.

After the first planarization layer 531 is cured for a set amount of time, first via holes 531a for exposing the contacts 524 of the ASIC 520 are formed by using a semiconductor process.

Figure 5C:
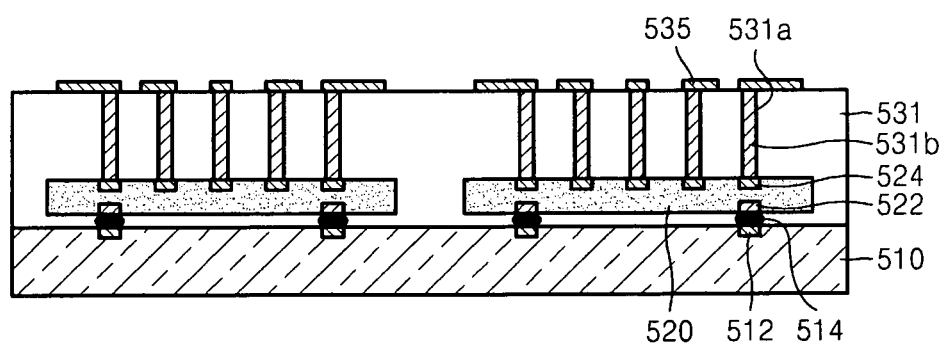

Referring to FIG. 5C, a first metal (e.g., Al or Cu) is used to form a first metal layer on the first planarization layer 531 and to fill the first via holes 531a. First contact plugs 531b and a connection wiring 535 connected to the first contact plugs 531b are formed by patterning the first metal layer. The connection wiring 535 is to be connected to second contact plugs 532b, which will be described later.

Figure 5D:
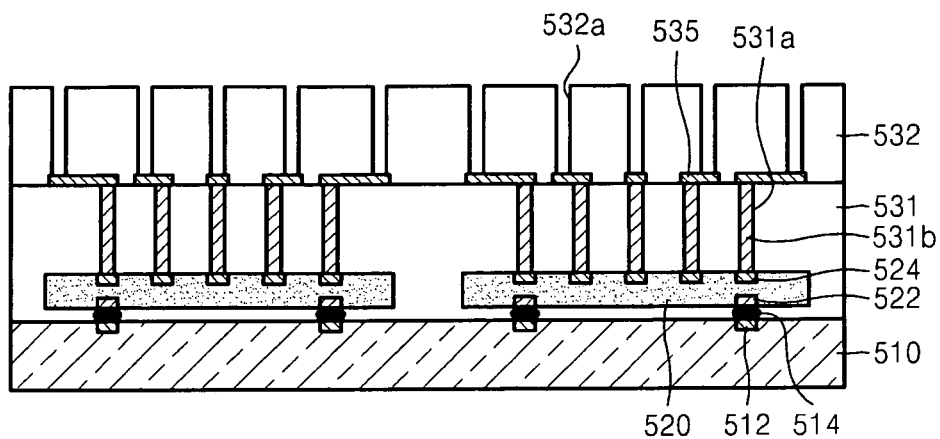

Referring to FIG. 5D, a second planarization layer 532 is formed on the first planarization layer 531 to a thickness of about 50 µm to about 300 µm. The second planarization layer 532 may be formed of the same material as the first planarization layer 531. Subsequently, the second planarization layer 532 is cured. In order to planarize the second planarization layer 532, a CMP process may be further performed.

Second via holes 532a are formed in the second planarization layer 532. The second via holes 532a are formed to contact pixel electrodes 542, which will be described later. The second contact plugs 532b are formed by filling the second via holes 532a with a second metal (not shown) by using a semiconductor process. The second metal may be the same metal as the first metal.

Figure 5E:
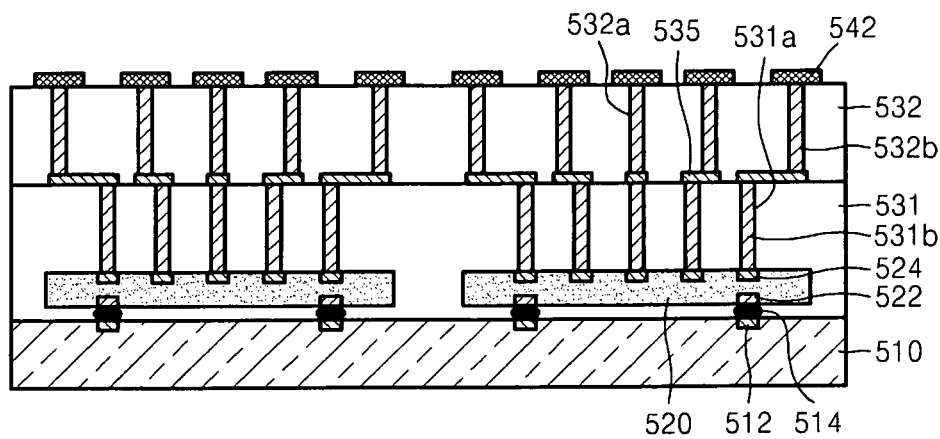

Referring to FIG. 5E, a third metal layer (not shown) that covers the second contact plug 532b may be deposited on the second planarization layer 532. The pixel electrodes 542 are formed by patterning the third metal layer.

The third metal layer may be formed of the same material as the second contact plugs 532b. Also, the third metal layer for the pixel electrodes 542 may be formed together with the second contact plugs 532b during a process of forming the second contact plugs 532b.

Figure 5F:
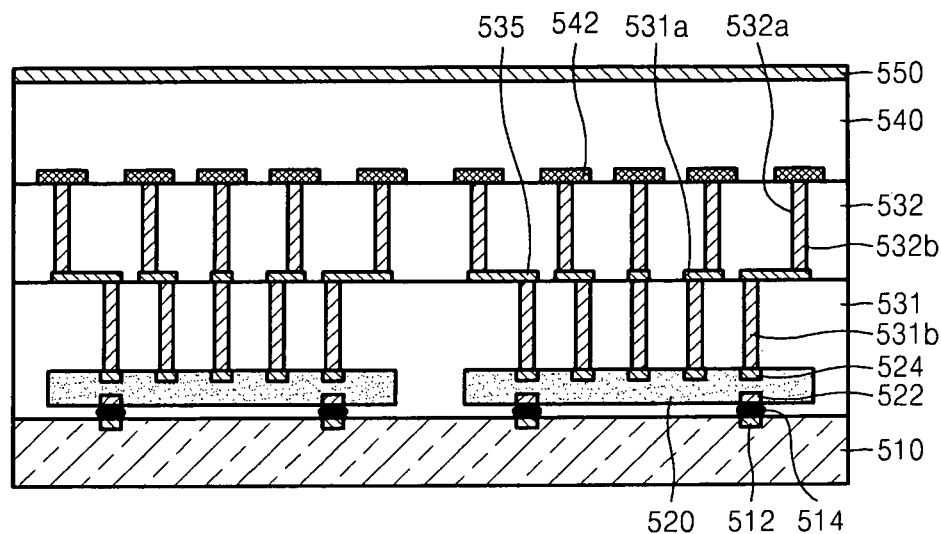

Referring to FIG. 5F, a photoconductor layer 540 and a common electrode 550 are sequentially formed on the second planarization layer 532. The photoconductor layer 540 may be formed of one material selected from the group consisting of a-Se, $HgI_2$, $PbI_2$, CdTe, CdZnTe, PbO and combinations thereof by sputtering or electron beam deposition. The common electrode 550 is deposited using Al or Cu to a thickness of approximately several hundreds to several thousands of Å.

Figure 6:
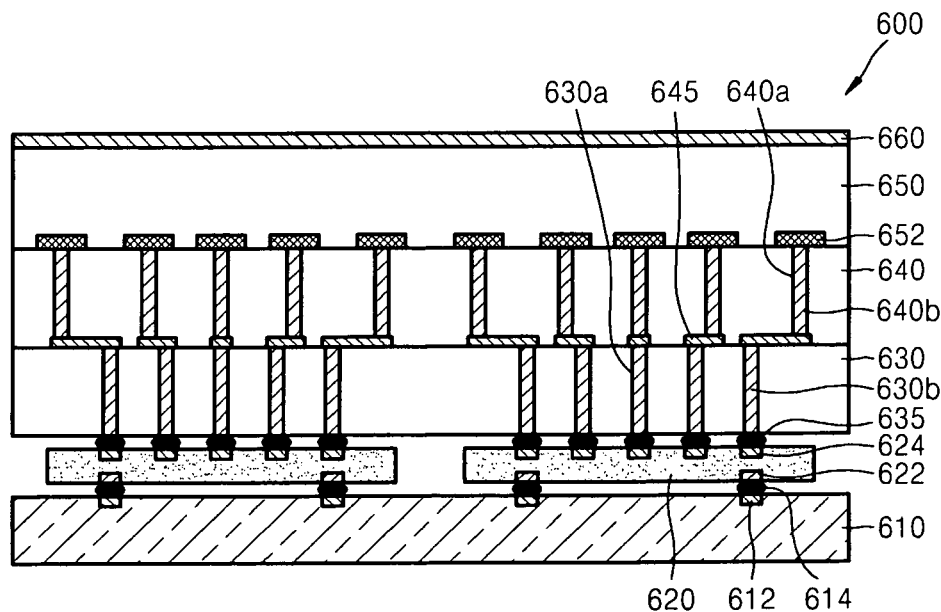
FIG. 6 is a schematic cross-sectional view of a large-scale X-ray detector according to still example embodiments.

FIG. 6 is a schematic cross-sectional view of a large-scale X-ray detector according to example embodiments.

Referring to FIG. 6, a large-scale X-ray detector 600 is constituted in such a way that ASICs 620 in the form of an array are tiled on a PCB 610. A plurality of contacts 622 are formed in lower portions of the ASICs 620. The contacts 622 of the ASIC 620 are electrically connected to contacts 612 of the PCB 610 via bumps 614.

An insulating layer 630 and a substrate 640 are sequentially stacked on the ASICs 620. The insulating layer 630 includes via holes 630a that correspond to the contacts 624 formed in upper portions of the ASICs 620, and first contact plugs 630b filled into the via holes 630a. The first contact plugs 630b are electrically connected to the contacts 624 via the bumps 635. A connection wiring 645 connected to the first contact plugs 630b is formed on the insulating layer 630.

The substrate 640 may be formed of silicon, silicon nitride, glass, or the like. Via holes 640a are formed in the substrate 640 to correspond to pixel electrodes 652, which will be described later, and second contact plugs 640b are filled into the via holes 640a. The second contact plugs 640b corresponding to the first contact plugs 630b are electrically connected with the first contact plugs 630b via the connection wiring 645. The first contact plugs 630b and the second contact plugs 640b may be formed of Al, Cu, or the like.

An X-ray detection unit including a photoconductor layer 650 is disposed on the substrate 640. The photoconductor layer 650 may be a layer formed of one material. The photoconductor layer 650 may be formed of one material selected from the group consisting of a-Se, $HgI_2$, $PbI_2$, CdTe, CdZnTe, PbO and combinations thereof. The photoconductor layer 650 generates an electric charge according to the strength of an X-ray that is incident on a top surface of the photoconductor layer 650. The photoconductor layer 650 may be divided into a plurality of seamless pixel areas. Each pixel electrode 652 is formed in each of the seamless pixel areas, and electric charges generated in the seamless pixel areas are converted into electrical signals at the pixel electrodes. The electrical signals are transmitted to the contacts 622 of the ASICs 620.

A continuous common electrode 660 is formed on the photoconductor layer 650. An electric field is formed in the photoconductor layer 650 according to a DC voltage applied to the common electrode 660, and holes or electrons of hole-electron pairs generated in the photoconductor layer 650 are moved to the pixel electrodes 652.

Although not shown in FIG. 6, the pixel electrodes 652 may be formed not in direct contact with the second contact plugs 640b. For example, a connection wiring may be formed between the second contact plugs 640b and the pixel electrodes 652.

Although the X-ray detector 600 of FIG. 6 includes one insulating layer formed between the substrate 640 and the ASICs 620, example embodiments of the present invention are not limited thereto. For example, a plurality of insulating layers may be formed between the substrate 640 and the ASICs 620, and contact plugs may be formed in each of the insulating layers, and the corresponding contact plugs may be electrically connected with one another via connection wirings.

FIGS. 7A through 7H are cross-sectional views illustrating a method of manufacturing the large-scale X-ray detector illustrated in FIG. 6.

The method of manufacturing the large-scale X-ray detector 600 of FIG. 6 includes forming an insulating layer including connection wirings on one surface of a substrate, combining a plurality of ASICs tiled on a PCB with the insulating layer, and forming an X-ray detection unit on the other surface of the substrate.

Figure 7A:
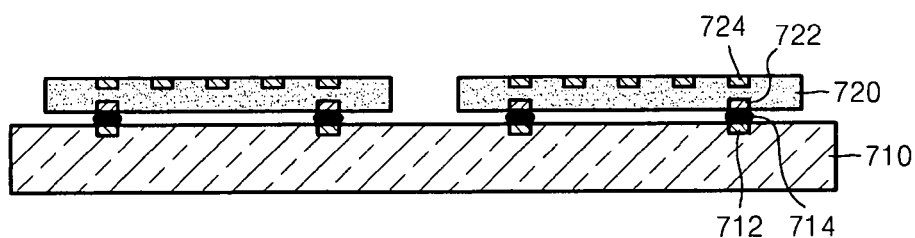
FIGS. 7A through 7H are cross-sectional views illustrating a method of manufacturing the large-scale X-ray detector illustrated in FIG. 6.

Tiling the ASICs on the PCB will now be described. Referring to FIG. 7A, a plurality of contacts 712 are formed on a PCB 710. A plurality of ASICs 720 in the form of an array is disposed on the PCB 710. Contacts 722 formed on bottom surfaces of the ASICs 720 are disposed to contact the contacts 712 formed on a top surface of the PCB 710. Each of the ASICs 720 is electrically connected to the PCB 710 by bumps 714 formed therebetween. The bumps 714 may be formed on the contacts 722 of the ASICs 720 or the contacts 712 of the PCB 710 in advance. Alternatively, the bumps 714 may be formed on both the contacts 722 of the ASICs 720 and the contacts 712 of the PCB 710 in advance, and then may be combined to electrically connect the ASICs 720 to the PCB 710. Contacts 724 are formed on top surfaces of the ASICs 720.

Forming the insulating layer including the connection wirings on one surface of the substrate will now be described.

Figure 7B:
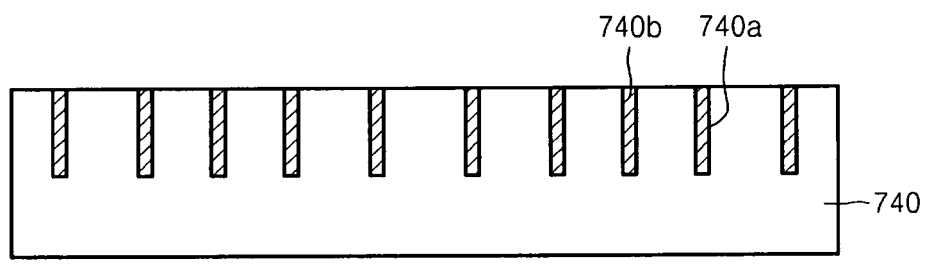

Referring to FIG. 7B, a plurality of first via holes 740a are formed in a substrate 740 to a set depth. The first via holes 740a are formed to correspond to the contacts 724 of the ASICs 720. The substrate 740 may be formed of silicon, silicon nitride, glass, or the like.

First contact plugs 740b are formed by filling a first metal (not shown) (e.g., Al or Cu) into the first via holes 740a.

Figure 7C:
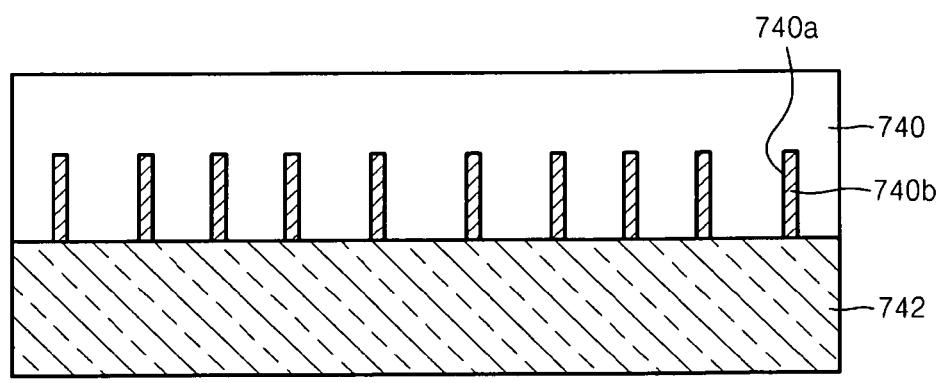

Referring to FIG. 7C, the substrate 740 is disposed on another substrate, for example, a glass substrate 742, in such a way that the first contact plugs 740b contact the glass substrate 742.

Figure 7D:
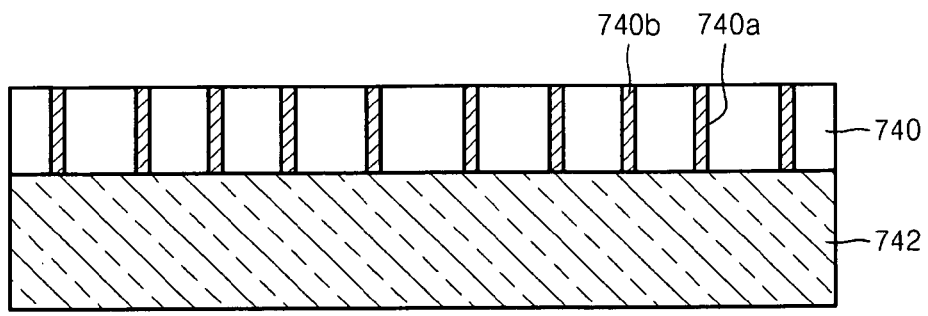

Referring to FIG. 7D, an exposed surface of the substrate 740 is removed using a CMP process to expose the first contact plugs 740b.

Figure 7E:
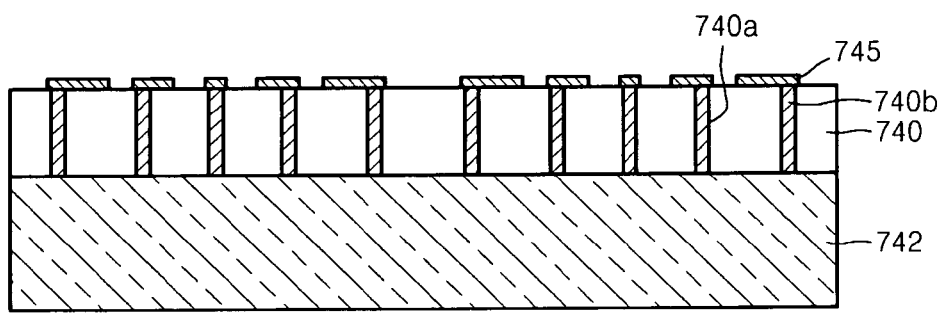

Referring to FIG. 7E, a second metal (not shown) is deposited on the substrate 740, and then the second metal is patterned to form connection wirings 745 connected to the first contact plugs 740b. The connection wirings 745 are to be connected to second contact plugs 730b, which will be described later.

Figure 7F:
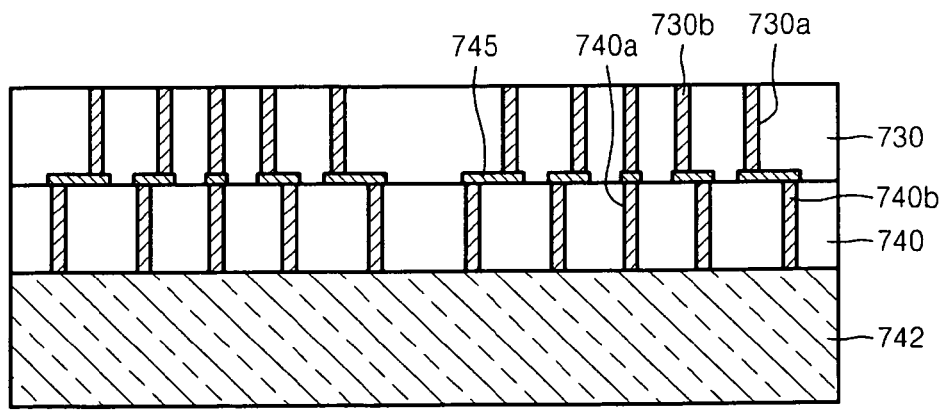

Referring to FIG. 7F, an insulating layer 730 is formed on the substrate 740. The insulating layer 730 may be formed of silicon oxide, silicon nitride, or the like.

Second via holes 730a are formed in the insulating layer 730. The second via holes 730a are formed to correspond to the contacts 724 and the connection wirings 745. The second contact plugs 730b are formed by filling a third metal (not shown) into the second via holes 730a by using a semiconductor process. The third metal may be the same metal as the first metal.

Figure 7G:
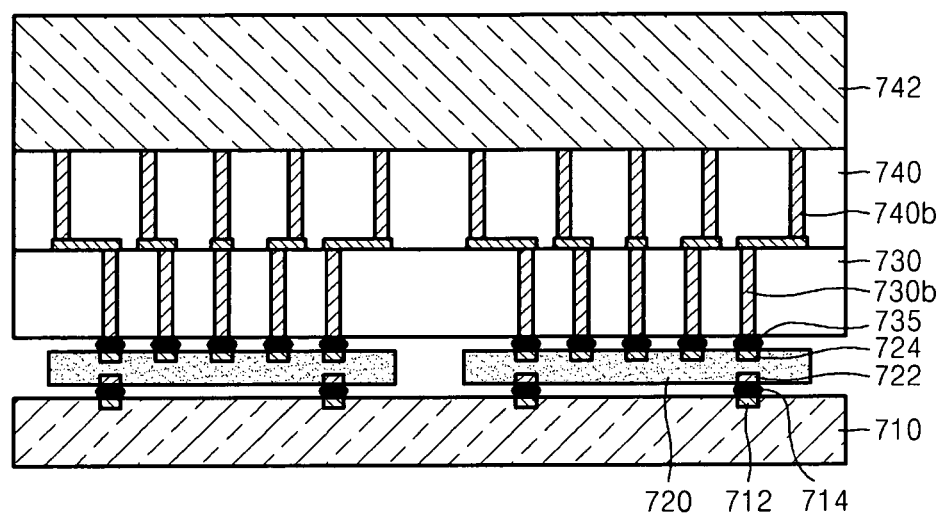

Referring to FIG. 7G, the insulating layer 730 is bonded to the PCB 710 via bumps 735 so as to electrically connect the contacts 724 of the ASICs 720 and the second contact plugs 730b. To this end, after the bumps 735 are formed on the second contact plugs 730b or the contacts 724, the PCB 710 and the insulating layer 730 are thermally bonded to each other.

Figure 7H:
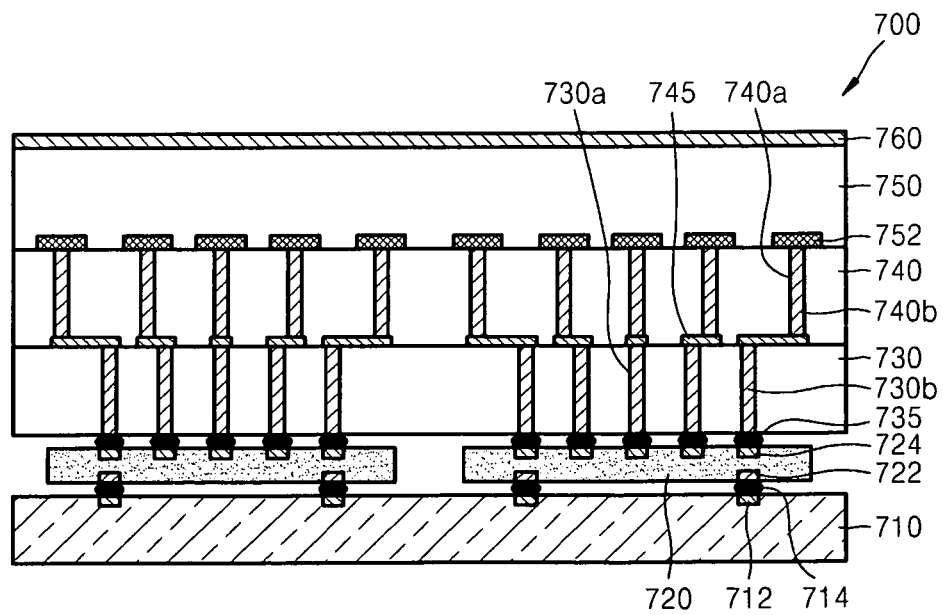

Referring to FIG. 7H, the glass substrate 742 is removed using a CMP process, for example.

A fourth metal layer (not shown) that covers the first contact plugs 740b may be deposited on the substrate 740. The fourth metal layer is patterned to form pixel electrodes 752.

A photoconductor layer 750 that covers the pixel electrodes 752 is formed on the substrate 740, and a common electrode 760 is formed on the photoconductor layer 750. The photoconductor layer 750 may be formed of one material selected from the group of a-Se, $HgI_2$, $PbI_2$, CdTe, CdZnTe, PbO and combinations thereof by sputtering or electron beam deposition. The common electrode 760 is deposited using Al or Cu to a thickness of approximately several hundreds to several thousands of Å.

Although the glass substrate 742 is used, example embodiments of the present invention are not limited thereto. For example, the X-ray detector 600 of FIG. 6 may be manufactured without using the glass substrate 742 in the method illustrated in FIGS. 7C through 7G.

As described above, in a large-scale X-ray detector according to example embodiments, an electrical connection between ASICs tiled on a planarization layer or a substrate and pixel electrodes may be easily performed. Furthermore, because an electric charge detected from a photoconductor layer in a seam area of the ASICs is conveyed to the ASICs, an image in a seamless imaging area may be more precisely reproduced.

It should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. An X-ray detector, comprising:
   a photoconductor layer configured to generate electrical charges according to an incident X-ray using an entire area of the photoconductor layer;
   a common electrode on an upper surface of the photoconductor layer;
   a plurality of pixel electrodes, configured to convert the electrical charges into electrical signals, on a lower surface of the photoconductor layer and divided into a plurality of groups; and
   a plurality of application-specific integrated circuits (ASICs) each corresponding to one of the groups,
   wherein each ASIC is configured to process the electrical signals conveyed via the pixel electrodes in the corresponding group, and
   the ASICs process the electrical signals so that seamless image information is collectively generated by the ASICs with respect to the entire area of the photoconductor layer.

2. The X-ray detector of claim 1, wherein the plurality of pixel electrodes and the ASICs contact each other via contact plugs.

3. The X-ray detector of claim 2, further comprising a polymer planarization layer between the pixel electrodes and the ASICs, wherein the contact plugs are within the polymer planarization layer.

4. The X-ray detector of claim 3, wherein the planarization layer includes a first planarization layer on the ASICs, and a second planarization layer on the first planarization layer,
   the contact plugs each include a first contact plug formed through the first planarization layer and a second contact plug formed through the second planarization layer, and
   the X-ray detector further includes a connection wiring connecting the first contact plug and the second contact plug.

5. The X-ray detector of claim 2, further comprising a substrate and an insulating layer sequentially stacked on the pixel electrodes,
   wherein the contact plugs each includes a first contact plug formed through the insulating layer and a second contact plug formed through the substrate, and
   the X-ray detector further includes a connection wiring connecting the first contact plug and the second contact plug.

6. The X-ray detector of claim 1, wherein the photoconductor layer is formed of at least one material selected from the group consisting of amorphous selenium (a-Se), $HgI_2$, $PbI_2$, CdTe, CdZnTe, PbO and combinations thereof.

7. An X-ray detector, comprising:
   a plurality of application-specific integrated circuits (ASICs) tiled on a printed circuit board (PCB) and electrically connected to the PCB, the plurality of ASICs including a plurality of contacts;
   a plurality of pixel electrodes corresponding to the plurality of ASICs;
   a photoconductor layer covering the plurality of pixel electrodes;
   a common electrode on the photoconductor layer to face the plurality of pixel electrodes and on which an X-ray is incident; and
   a plurality of contact plugs electrically connecting the pixel electrodes and the contacts of the ASICs.

8. The X-ray detector of claim 7, further comprising:
   a planarization layer covering the plurality of ASICs on the PCB;
   wherein the plurality of pixel electrodes are on the planarization layer; and
   the contact plugs fill via holes formed in the planarization layer.

9. The X-ray detector of claim 8, wherein the planarization layer includes a polymer layer.

10. The X-ray detector of claim 8, further comprising a first connection wiring electrically connecting the plurality of contact plugs and the plurality of pixel electrodes.

11. The X-ray detector of claim 10, wherein the first connection wiring is on the planarization layer.

12. The X-ray detector of claim 11, further comprising:
   a plurality of the planarization layers on the ASICs; and
   a second connection wiring between the plurality of planarization layers and connecting the plurality of contact plugs formed in adjacent planarization layers,
   wherein the pixel electrodes are on an uppermost planarization layer of the planarization layers, and
   the plurality contact plugs are formed in via holes in each of the planarization layers.

13. The X-ray detector of claim 8, wherein the photoconductor layer is formed of at least one material selected from the group consisting of amorphous selenium (a-Se), $HgI_2$, $PbI_2$, CdTe, CdZnTe, PbO and combinations thereof.

14. The X-ray detector of claim 8, wherein the plurality of ASICs include single crystalline silicon.

15. The X-ray detector of claim 7, further comprising:
   an insulating layer and a substrate sequentially stacked on the plurality of ASICs;
   wherein the plurality of pixel electrodes are on the substrate, and
   the contact plugs fill via holes formed in each of the substrate and the insulating layer.

16. The X-ray detector of claim 15, wherein the contact plugs in the insulating layer and the contacts of the ASICs are connected to one another by bumps.

17. The X-ray detector of claim 15, further comprising a first connection wiring between, and electrically connecting, the contact plugs in the substrate and the contact plugs in the insulating layer.

18. The X-ray detector of claim 17, wherein the first connection wiring is on the substrate.

19. The X-ray detector of claim 18, further comprising a plurality of the insulating layers formed on the ASICs; and
a second connection wiring between adjacent insulating layers and connecting the contact plugs in the adjacent insulating layers,
wherein the contact plugs are formed in each of the insulating layers.

20. The X-ray detector of claim 15, wherein the photoconductor layer is formed of at least one material selected from the group consisting of amorphous selenium (a-Se), $HgI_2$, $PbI_2$, CdTe, CdZnTe, PbO and combinations thereof.

21. The X-ray detector of claim 15, wherein the plurality of ASICs include single crystalline silicon.

22. A method of manufacturing an X-ray detector, the method comprising:
tiling a plurality of application-specific integrated circuits (ASICs) in the form of an array on a printed circuit board (PCB);
forming a plurality of contact plugs corresponding to contacts of the ASICs;
forming a plurality of pixel electrodes that contact the plurality of contact plugs, wherein the plurality of contact plugs electrically connect the plurality of pixel electrodes to the plurality of ASICs;
forming a photoconductor layer covering the plurality of pixel electrodes; and
forming a common electrode on the photoconductor layer to face the plurality of pixel electrodes and on which an X-ray is incident.

23. The method of claim 22, further comprising:
depositing a planarization layer that covers the plurality of ASICs on the PCB, prior to forming the plurality of contact plugs; and
forming via holes corresponding to the contacts of the ASICs in the planarization layer,
wherein the plurality of contact plugs are formed in the plurality of via holes, and
the plurality of pixel electrodes and photoconductor layer are sequentially formed on the planarization layer.

24. The method of claim 23, wherein the planarization layer includes a polymer layer.

25. The method of claim 23, wherein depositing the planarization layer includes performing chemical mechanical polishing (CMP) on the planarization layer.

26. The method of claim 23, wherein forming the contact plugs includes:
forming a first metal layer on the planarization layer and in the via holes;
forming the plurality of contact plugs from the first metal layer in the plurality of via holes; and
forming a first connection wiring connected to the pixel electrodes by patterning the first metal layer on the planarization layer.

27. The method of claim 22, further comprising:
depositing a plurality of planarization layers on the PCB;
forming via holes corresponding to the contacts of the ASICs in each planarization layer, wherein the plurality of contact plugs are in the via holes; and
forming a second connection wiring that connects the contact plugs in adjacent planarization layers of the plurality of planarization layers.

28. The method of claim 23, wherein the photoconductor layer is formed of at least one material selected from the group consisting of amorphous selenium (a-Se), $HgI_2$, $PbI_2$, CdTe, CdZnTe, PbO and combinations thereof.

29. The method of claim 23, wherein the ASICs include single crystalline silicon.

30. The method of claim 22, further comprising:
forming first via holes corresponding to the contacts of the ASICs in a substrate and forming first contact plugs selected from among the contact plugs in the first via holes;
forming a first connection wiring connected to the first contact plugs on a first surface of the substrate;
forming an insulating layer that covers the first connection wiring on the first surface of the substrate;
forming second via holes exposing the first connection wiring in the insulating layer and forming second contact plugs selected from among the contact plugs in the second via holes; and
bonding the substrate to the plurality of ASICs by bumps so that the second contact plugs are connected to the contacts of the plurality of ASICs,
wherein the plurality of pixel electrodes contact the first contact plugs on a second surface of the substrate, and the common electrode is formed on the second surface of the substrate.

31. The method of claim 30, wherein forming the first contact plugs includes:
forming the via holes in the substrate to a set depth;
forming the first contact plugs in the via holes;
disposing the insulating substrate to contact the first contact plugs in the substrate; and
exposing the first contact plugs by performing chemical mechanical polishing (CMP) on the substrate, and
wherein forming the pixel electrodes includes removing the insulating substrate.

32. The method of claim 22, further comprising:
forming first via holes corresponding to the contacts of the ASICs in a substrate and forming first contact plugs from among the contact plugs in the first via holes;
forming a first connection wiring connected to the first contact plugs on a first surface of the substrate;
forming a plurality of insulating layers that cover the first connection wiring on the first surface of the substrate;
forming second via holes exposing the first connection wiring in each of the insulating layers;
forming second contact plugs from among the contact plugs in the second via holes;
forming a second connection wiring that connects the second contact plugs between adjacent insulating layers of the plurality of insulating layers; and
bonding the substrate to the plurality of ASICs by bumps so that the second contact plugs are connected to the contacts of the plurality of ASICs,
wherein the plurality of pixel electrodes contact the first contact plugs on a second surface of the substrate and are connected to exposed second contact plugs, and
the common electrode is formed on the second surface of the substrate.

33. The method of claim 30, wherein the photoconductor layer is formed of at least one material selected from the group consisting of amorphous selenium (a-Se), $HgI_2$, $PbI_2$, CdTe, CdZnTe, PbO and combinations thereof.

34. The method of claim 30, wherein the ASICs include single crystalline silicon.

* * * * *